United States Patent
Li et al.

(10) Patent No.: US 8,232,475 B2
(45) Date of Patent: Jul. 31, 2012

(54) NANO-HOLE ARRAY IN CONDUCTOR ELEMENT FOR IMPROVING THE CONTACT CONDUCTANCE

(75) Inventors: Jong-Lih Li, Taipei (TW); Chieh-Hsiung Kuan, Taipei (TW)

(73) Assignee: National Taiwan University, Daan Chiu, Taipei (TW)

( * ) Notice: Subject to any disclaimer, the term of this patent is extended or adjusted under 35 U.S.C. 154(b) by 707 days.

(21) Appl. No.: 12/368,755

(22) Filed: Feb. 10, 2009

(65) Prior Publication Data
US 2010/0071932 A1 Mar. 25, 2010

(30) Foreign Application Priority Data

Sep. 19, 2008 (TW) ................................. 97136177 A

(51) Int. Cl.
*H01B 5/08* (2006.01)
(52) U.S. Cl. .................. 174/126.2; 174/126.4; 977/755; 977/784
(58) Field of Classification Search .................... 257/13, 257/14, 9, 3; 204/431; 313/495; 428/138; 430/322; 422/50; 438/706, 707, 746, 678, 438/475; 174/126.2, 126.4; 977/700, 755, 977/784
See application file for complete search history.

(56) References Cited

U.S. PATENT DOCUMENTS

| | | | |
|---|---|---|---|
| 5,246,576 A * | 9/1993 | Leader et al. ................. | 204/431 |
| 6,359,288 B1 * | 3/2002 | Ying et al. ..................... | 257/14 |
| 6,476,409 B2 * | 11/2002 | Iwasaki et al. ................ | 257/13 |
| 6,541,386 B2 * | 4/2003 | Aiba et al. .................... | 438/707 |
| 6,610,463 B1 * | 8/2003 | Ohkura et al. ................ | 430/322 |
| 6,693,024 B2 * | 2/2004 | Lehmann et al. ............. | 438/542 |
| 6,924,023 B2 * | 8/2005 | Ohkura et al. ................ | 428/138 |
| 7,318,907 B2 * | 1/2008 | Stark et al. .................... | 422/50 |
| 7,358,193 B2 * | 4/2008 | Sato et al. ..................... | 438/706 |
| 7,501,649 B2 * | 3/2009 | Naya et al. ....................... | 257/9 |
| 7,732,015 B2 * | 6/2010 | Nomura et al. ............... | 427/277 |
| 7,879,734 B2 * | 2/2011 | Fukutani et al. ............. | 438/745 |
| 7,973,463 B2 * | 7/2011 | Murakami .................... | 313/495 |
| 2010/0071932 A1 * | 3/2010 | Li et al. ....................... | 174/126.2 |

FOREIGN PATENT DOCUMENTS

JP 11-200090 * 7/1999
TW 200300052 5/2003

* cited by examiner

*Primary Examiner* — Ana Fortuna
(74) *Attorney, Agent, or Firm* — Muncy, Geissler, Olds & Lowe, PLLC

(57) ABSTRACT

A nano-hole array for improving contact conductance of a conductor element that consists of a first layer and a second layer is provided. The nano-hole array formed between the first and second layers comprises a plurality of holes. The contact conductance of the conductor element is enhanced by reducing the hole size of the hole array, increasing the occupation rate of the hole array, and performing thermal annealing.

19 Claims, 4 Drawing Sheets

NANO-HOLE ARRAY IN CONDUCTOR ELEMENT FOR IMPROVING THE CONTACT CONDUCTANCE

This application claims priority based on Application TAIWAN 97136177 filed Sep. 19, 2008.

BACKGROUND OF THE INVENTION

1. Field of the Invention

The present invention relates to a nano-hole array, and more particularly, to a nano-hole array for improving contact conductance of an interface for a conductor element.

2. Description of the Prior Art

In the field of semiconductor components, metal-semiconductor ohmic contacts play an important role in component-to-component bridging and component-to-outside bridging. A junction is good enough to function as an ohmic contact only if the junction leaves the operating characteristics of a component unchanged, provides the component with required current at applied voltage, and exhibits a low junction-voltage-drop to operating-component-voltage-drop ratio. Regarding component application, an ohmic contact is vitally important to a semiconductor component fabrication process, as an ohmic contact is a factor in the contact conductivity of the metal semiconductor junction.

Junction resistance at an interface is conventionally reduced by a high-power metal film, preferably a multilayer metal film that provides a low-resistance junction. Alternatively, junction resistance at an interface is conventionally reduced by increasing doping concentration for semiconductors or performing rapid thermal annealing at 450° C.

One prior art, "Method of reducing interface energy level of contact layer between the semiconductor material and the electrode and fabrication thereof" as disclosed in R.O.C. Publication No. 200300052 teaches directly depositing, upon completion of structural growth of a semiconductor material, an electrode contact metal layer of an appropriate thickness on the semiconductor material without leaving the growth system of the semiconductor material or quitting the vacuum state, rather than forming a natural oxide layer capable of increasing contact resistance at the interface between the semiconductor material and the electrode contact metal layer. However, the prior art fails to enhance contact conductivity of the junctions efficiently.

SUMMARY OF THE INVENTION

It is the primary objective of the present invention to enhance contact conductivity of a conductor element and improve a conventional process of thermal annealing treatment accomplishable only when performed at high temperature and for a long period.

To achieve the above objectives, the present invention provides a nano-hole array for improving contact conductance of a conductor element. The conductor element comprises a first layer and a second layer. A nano-hole array is formed on the first layer so as for the nano-hole array to be sandwiched between the first layer and the second layer. The nano-hole array comprises a plurality of holes.

The area ratio of the nano-hole array to the first layer is greater than 8%.

The first layer and the second layer are made of semiconductor material or metal.

The holes of the nano-hole array are rectangular, round, or elliptic, and preferably square.

The side length of the square holes is 20 nm to 1000 nm long.

The side length of the square holes is preferably 20 nm approximately, and the distance between the square holes is 60 nm approximately.

The side length of the square holes is preferably 240 nm approximately, and the distance between the square holes is 600 nm approximately.

The side length of the square holes is preferably 480 nm approximately, and the distance between the square holes is 850 nm approximately.

The square holes are approximately 100 nm deep.

The first layer is a semiconductor substrate, and the second layer is a metal film. The semiconductor substrate is made of silicon substrate, and the metal film is an aluminum film. The aluminum film is deposited to a thickness of 330 nm approximately.

To further enhance conductivity, the nano-hole array for improving contact conductance of a conductor element according to the present invention further comprises a rapid thermal annealing treatment process.

The first layer and the second layer are treated by rapid thermal annealing. The rapid thermal annealing takes place at temperature between 340° C. and 420° C., preferably at 340° C. The rapid thermal annealing lasts for 10 minutes.

Given the modification of the surfaces of the layers, the nano-hole array of the present invention is capable of providing higher contact conductivity of the interfaces between the conductor elements, because of periodic nano-hole configuration and the area ratio of the nano-hole array to the first layer. Unlike the prior art that taught changing contact conductance by performing rapid thermal annealing at high temperature, the present invention also discloses changing contact conductance by performing rapid thermal annealing at low temperature merely whether on a component or integrated circuit (IC). Furthermore, the aluminum film layer of the present invention is formed with a cladding layer of crystalline grain having better thermal conduction than amorphous structure.

DETAILED DESCRIPTION OF THE EMBODIMENTS

The objectives, features, and effects of the present invention will be best understood by the reference to the following detailed description of the preferred embodiments when read in conjunction with the accompanying drawings. A nano-hole array of the present invention is formed on a first layer of a conductor element so as to function as an interface. Forming the nano-hole array of the present invention comprises the formation of the periodic nano-hole array configuration on the first layer of the conductor element by conventional semiconductor technique and then the formation of a second layer on top of the nano-hole array. The first layer and the second layer are made of semiconductor material or metal. The semiconductor materials are silicon (Si), germanium (Ge), or group II-V compound-based semiconductors. The metals are titanium (Ti), aluminum (Al), nickel (Ni), copper (Cu), indium (In), magnesium (Mg), or platinum (Pt). Contact conductivity is enhanced by the nano-hole array configuration of the present invention, whether the interface is formed from homogeneous or heterogeneous materials. The preferred embodiment of the present invention is exemplified by a semiconductor material and a metal film, such as a silicon substrate and an aluminum film, respectively.

Figure 1:
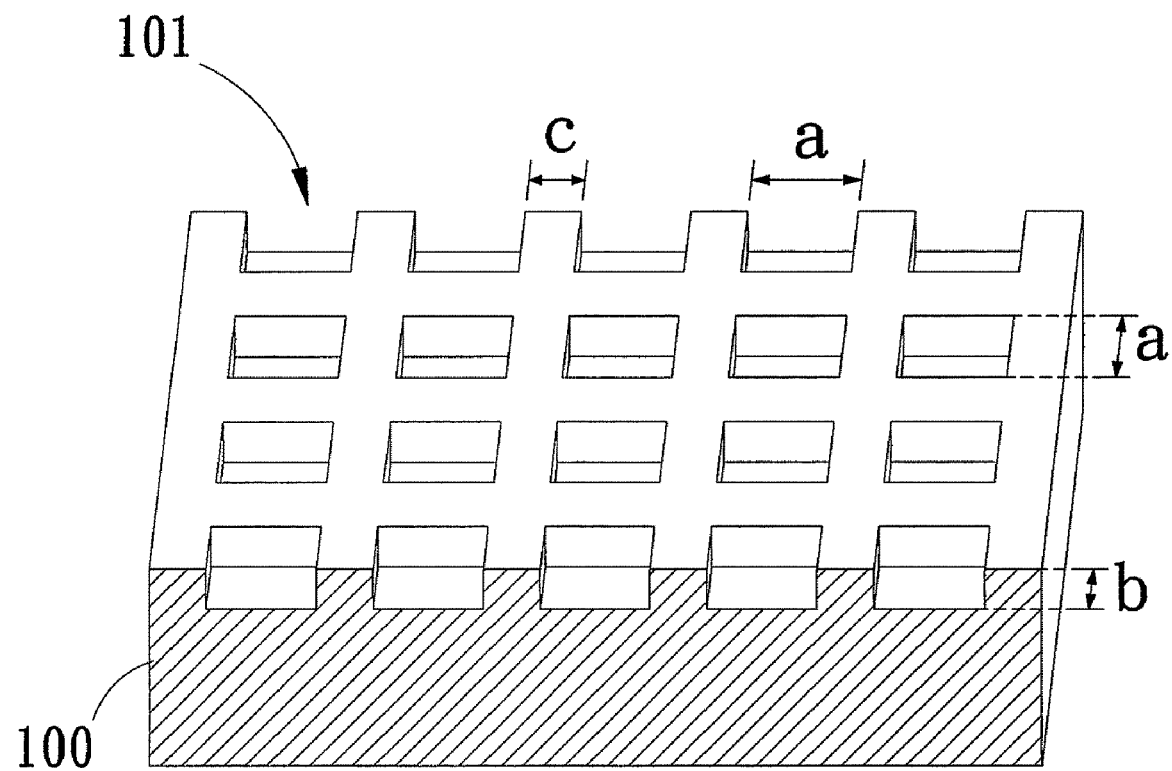
FIG. 1 is a partial cross-sectional view of a nano-hole array according to the present invention.

Referring to FIG. 1, which is a partial cross-sectional view of a nano-hole array according to the present invention, a nano-hole array 101 is formed on a silicon substrate 100 by Electron Beam Lithography (EBL) and Reactive Ion Etching (RIE). The nano-hole array 101 comprises a plurality of holes. The holes are rectangular, round, or elliptical, etc. The preferred embodiment is exemplified by square holes with side length 'a' and depth 'b'. The distance between the holes is denoted by 'c'. Owing to the distance 'c', the holes are uniformly distributed across the silicon substrate rather than limited to a portion of the silicon substrate surface. The silicon substrate 100 used in the preferred embodiment is 50 μm long, 100 μm wide, and 300 nm high, and the large distance 'c' comes a small area ratio of the nano-hole array 101 to the silicon substrate 100. In other words, the small area ratio indicates that the total area of the nano-holes together account on the silicon substrate 100 is small. The size and total area of the nano-holes correlate with contact conductivity $G_N(S/cm^2)$.

Afterward, the silicon substrate 100 and the nano-hole array 101 are treated with oxygen plasma for three minutes so as to remove residual photoresist configured for forming the nano-hole array 101. Then, the native oxide on the silicon substrate 100 and the nano-hole array 101 is removed by a hydrofluoric acid (HF) infiltration process. Finally, at pressure of $10^{-6}$ torr, an aluminum film approximately 330 nm thick is deposited on the silicon substrate 100 and the nano-hole array 101 by thermal evaporation, so as to form a metal semiconductor contact (MSC).

Table 1 and Table 2 show the correlation between nano-hole side length, distance, and area ratio in the preferred embodiment of the present invention.

TABLE 1

| | category | | | | | | |
| --- | --- | --- | --- | --- | --- | --- | --- |
| | A | B | C | D | E | F | G |
| hole side length 'a' (μm) | 0.02 | 0.05 | 0.10 | 0.15 | 0.24 | 0.48 | 0.72 |
| distance 'c' (μm) | 0.06 | 0.13 | 0.25 | 0.37 | 0.6 | 0.85 | 1.04 |
| area ratio (%) | 11 | 15 | 16 | 16 | 16 | 32 | 48 |
| conductivity (S/cm$^2$) | 1.498 | 0.402 | 0.146 | 0.083 | 0.043 | 0.017 | 2.16E−3 |

TABLE 2

| | category | | | | | |
| --- | --- | --- | --- | --- | --- | --- |
| | H | I | J | K | L | M |
| hole side length 'a' (μm) | 0.96 | 1.2 | 2.4 | 4.8 | 12.0 | 20.0 |
| distance 'c' (μm) | 1.2 | 1.34 | 6.0 | 8.18 | 13.3 | 40.0 |
| area ratio (%) | 64 | 80 | 16 | 34 | 81 | 25 |
| conductivity (S/cm$^2$) | 2.06E−3 | 1.19E−3 | 6.68E−4 | 3.61E−4 | 1.02E−4 | 2.86E−5 |

Table 1 and Table 2 show a greater than 8% area ratio of the nano-hole array 101 to the silicon substrate 100, 0.02 to 20.0 μm side length 'a' of the square holes of the nano-hole array 101, and 0.06 to 40.0 μm distance 'c'. Depth 'b' of the nano-hole array 101 is approximately 100 nm.

Figure 2:
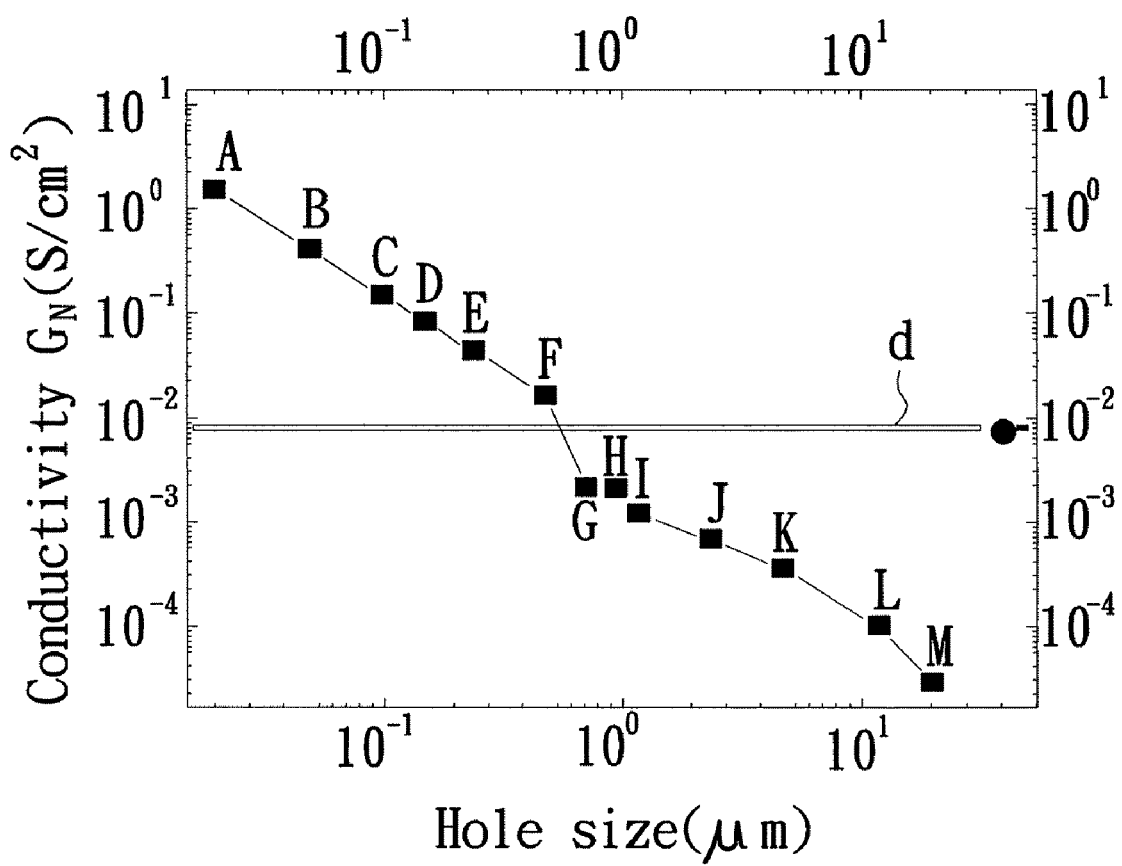
FIG. 2 is a schematic view of correlation between conductivity and nano-hole size of a nano-hole array according to the present invention.

FIG. 2 is a schematic view of correlation between conductivity and nano-hole size of a nano-hole array according to the present invention. The horizontal axis in FIG. 2 represents the size of the nano-holes, that is, the side length of the square holes. The vertical axis in FIG. 2 represents conductivity $G_N$. Category A to M in FIG. 2 correspond to category A to M in Table 1 and Table 2, respectively. Referring to FIG. 2, the smaller the nano-hole size is, the higher the conductivity is. Take category A, E, and M as examples, conductivity in category A is 1.498 S/cm$^2$, conductivity in category E is 0.043 S/cm$^2$, and conductivity in category M is 2.86×10$^{-5}$ S/cm$^2$. Category E and M differ in conductivity by the third power of 10. As shown in FIG. 2, if the nano-hole size is 240 nm and 480 nm, like those of category E and F, then the distance is 600 nm and 850 nm, respectively, indicating improved conductivity. However, if the hole size of the nano-hole array 101 further decreases to 20 nm and with the distance 60 nm, it would indicate even much higher conductivity.

The horizontal line 'd' in FIG. 2 represents silicon substrate provided with no nano-hole array at all but treated with rapid thermal annealing at a high temperature of 450° C. for 30 minutes. As shown in the drawing, the silicon substrate provided with a nano-hole array according to the present invention demonstrates relatively high conductivity when the nano-hole size is less than 500 nm, which is still the case even if neither silicon substrate nor aluminum film is treated with rapid thermal annealing at high temperature.

Figure 3:
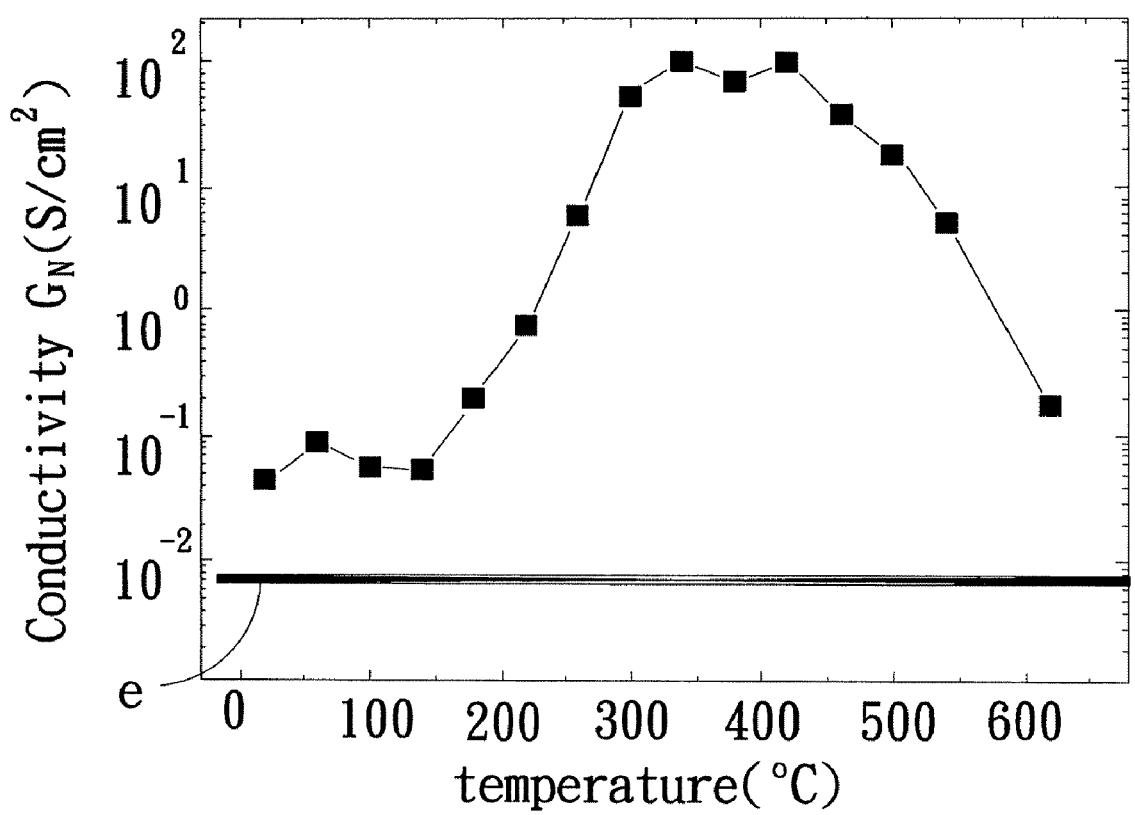
FIG. 3 is a schematic view of correlation between conductivity and rapid thermal annealing temperature of a conductor element having a nano-hole array according to the present invention.

To further enhance conductivity, the present invention discloses, in the preferred embodiment, performing rapid thermal annealing treatment on a conductor element deposited with an aluminum film and provided with a nano-hole array, wherein the rapid thermal annealing takes place in a gaseous nitrogen environment. Referring to FIG. 3, which is a schematic view of correlation between conductivity and rapid thermal annealing temperature of the conductor element having the nano-hole array of the category 'F', with 480 nm hole size, according to the present invention, wherein the rapid thermal annealing treatment of each element lasts for just 10 minutes. The horizontal line 'e' in the drawing depicts the result of the high-temperature rapid thermal annealing treatment performed on a conductor element without any nano-hole array at 450° C. for 30 minutes. As shown in the drawing, relatively high conductivity is achieved when rapid thermal annealing takes place at temperature between 340° C. and 420° C., and preferably at 340° C. As revealed by the marked difference between a conductor element with a nano-hole array and a conductor element without any nano-hole array in terms of the result of rapid thermal annealing treatment, the present invention teaches performing rapid thermal annealing at temperature as low as 340° C. with a view to increase the conductivity to the fourth power of 10 approximately.

Figure 4:
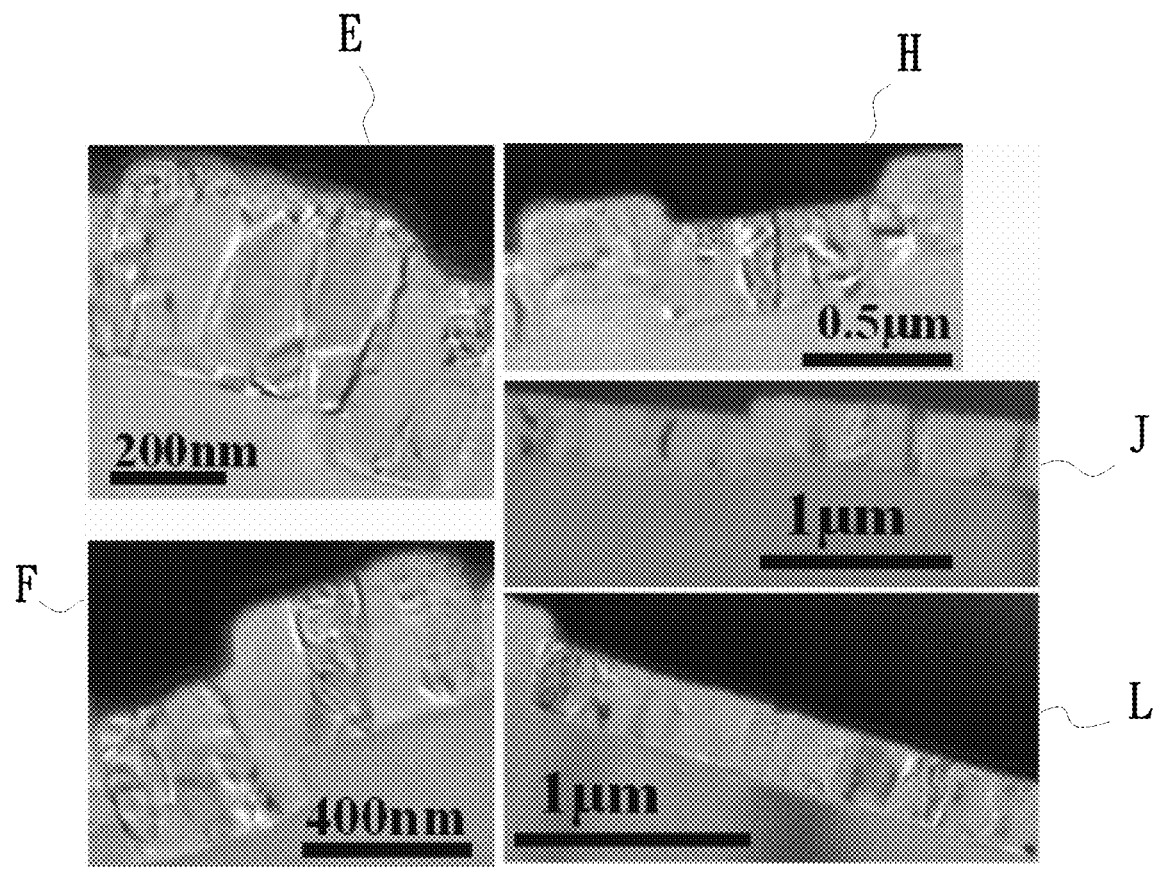
FIG. 4 is a cross-sectional view showing crystalline structures depending on the hole size of the hole array according to the present invention.

FIG. 4 is a cross-sectional view showing crystalline structure of a nano-hole array sample with different hole size according to the present invention. The drawing is based on the findings of observation of the microstructure of the aluminum film formed on a hole array with different hole sizes, using a Transmission Electron Microscope (TEM). In FIG. 4, the black region represents a deposited layer of platinum (Pt) for holding a specimen for observation with the TEM. In FIG. 4, category 'E, F, H, J and L' represent cross-sectional views of the crystalline structure when side length of the nano-holes is 240 nm, 480 nm, 960 nm, 2400 nm, and 12 μm, respectively. Take category 'E' as example, the upper black region represents a layer of platinum (Pt) that functions as a support, the middle uneven layer represents an aluminum film deposited on a nano-hole array, and the lower layer represents a silicon substrate with a nano-hole array. As shown in the drawing, the smaller the hole size of the nano-hole array is, the denser and more conspicuous the crystalline structure of the aluminum film is (as indicated by the contrast of the color of the crystal of the aluminum film in the drawing; the contrast of the image increases with quantity of crystal). The cladding layer of crystalline grain (i.e., crystalline structure of aluminum film) increases efficiency of heat dissipation of the conductor element. Hence, compared to amorphous structure whereby heat transfer is readily prevented, the cladding layer of crystalline grain excels amorphous structure in thermal conduction.

In short, contact conductivity correlates closely with interface characteristics, whether it is involved in the components or the integrated circuits. The present invention discloses a nano-hole array for improving contact conductance. The nano-hole array functions as an interface in the presence of a silicon substrate with a modified surface. An aluminum film is deposited on the interface, so as to enhance conductivity of a conductor element. Conductivity depends on the area ratio of the nano-hole array to the silicon substrate and the size of nano-holes. Rapid thermal annealing treatment is performed to increase the area of contact between aluminum crystal in the aluminum film and the silicon substrate, enhance migration rate of carrier transport, and eliminate gaseous oxygen on the interface. In addition, unlike the prior art that taught performing rapid thermal annealing at high temperature, the present invention discloses performing rapid thermal annealing at low temperature for a short period of time so as to enhance conductivity. Furthermore, the aluminum film of the present invention is formed with a cladding layer of crystalline grain having better thermal conduction than amorphous grain.

The foregoing preferred embodiment is only illustrative of the features and functions of the present invention but is not intended to restrict the scope of the present invention. It is apparent to those skilled in the art that all equivalent variations and replacement made in the foregoing preferred embodiment should fall within the scope of the present invention. Hence, the present invention should fall within the scope of the appended claims.

What is claimed is:

1. A nano-hole array for improving contact conductance of a conductor element comprising a first layer and a second layer, wherein a nano-hole array comprising a plurality of holes opening upward is formed from a portion of the first layer and disposed on an upper portion of the first layer, and the upper portion of the first layer is in direct contact with the second layer and completely covered therewith, the second layer having a crystalline structure therein.

2. The nano-hole array of claim 1, wherein a ratio of area of the first layer occupied by the holes of the nano-hole array to area of the first layer is greater than 8%, and the hole-occupied surface area of the first layer parallels a surface of the first layer.

3. The nano-hole array of claim 1, wherein the first layer material and the second layer are made of one of semiconductor material or metal.

4. The nano-hole array of claim 3, wherein the first layer is semiconductor substrate, and the second layer is a metal film.

5. The nano-hole array of claim 4, wherein the semiconductor substrate is a silicon substrate, and the metal film is an aluminum film.

6. The nano-hole array of claim 5, wherein the aluminum film is deposited to a thickness of 330 nm approximately.

7. The nano-hole array of claim 3, wherein the first layer and the second layer are treated by rapid thermal annealing.

8. The nano-hole array of claim 7, wherein the rapid thermal annealing takes place at temperature between 340° C. and 420° C.

9. The nano-hole array of claim 8, wherein the rapid thermal annealing takes place at temperature 340° C.

10. The nano-hole array of claim 9, wherein the rapid thermal annealing lasts for 10 minutes.

11. The nano-hole array of claim 3, wherein the holes are rectangular, round, elliptical, or square.

12. The nano-hole array of claim 11, wherein depth of the square holes is approximately 100 nm.

13. The nano-hole array of claim 11, wherein side length of the square holes is between 20 nm and 1000 nm.

14. The nano-hole array of claim 13, wherein the side length of the square holes is approximately 20 nm.

15. The nano-hole array of claim 14, wherein distance between the square holes is approximately 60 nm.

16. The nano-hole array of claim 13, wherein the side length of the square holes is approximately 240 nm.

17. The nano-hole array of claim 16, wherein distance between the square holes is approximately 600 nm.

18. The nano-hole array of claim 13, wherein side length of the square holes is approximately 480 nm.

19. The nano-hole array of claim 18, wherein distance between the square holes is approximately 850 nm.

* * * * *